3,351,499
Patented Nov. 7, 1967

3,351,499

OIL IMPREGNATED THERMOELECTRIC ELEMENT WITH ELECTROPLATED METAL CONTACT AND METHOD OF PRODUCING SAME

Laurence H. Weitzman, Irwin, and William R. Harding, Jeannette, Pa., assignors to Westinghouse Electric Corporation, Pittsburgh, Pa., a corporation of Pennsylvania No Drawing. Filed Oct. 18, 1962, Ser. No. 231,595
3 Claims. (Cl. 136—236)

The present invention relates to a thermoelectric element embodying an oil impregnated thermoelectric body and a proces for preparing the same.

Heretofore in the preparation of thermoelectric pellets, a quantity of powdered thermoelectric material was compressed in a die into a compact and the resultant compact was sintered at a suitable temperature to ensure structural integrity. It was desirable that the pressed pellets have a density of almost 100% of theoretical. If compacted to a density of below 100%, this meant that the pellets had a certain degree of porosity. When the pellets were electroplated or vapor plated on the end surfaces to provide solderable contacts, the plating solution diffused into the pellets through the pores or voids thereby yielding a spotty finish owing to steam bursts and other effects, from the entrapped solution. Also, the electrical resistance and metallurgical bond between the metal coating and the thermoelectric pellet was non-uniform and unreliable.

The object of the present invention is to provide a thermoelectric element comprising a compressed, oil impregnated, body of thermoelectric material having end surfaces and a metallic coating applied on the end surfaces and in good electrical and metallurgical contact therewith.

Another object of the invention is to provide a method of treating a thermoelectric body by first compressing a quantity of powdered thermoelectric material, sintering the body, the sintered body having a substantial number of voids, impregnating the body with an oleginous substance to fill the voids, and applying a metal coating on the end surfaces of the body, the coating being in good electrical and metallurgical contact therewith.

Other objects of the invention will in part be obvious and will in part appear hereinafter.

In accordance with the present invention and in attainment of the foregoing objects there is provided a thermoelectric element produced by compressing a quantity of powdered thermoelectric material into a shaped body. The body is then sintered at a suitable temperature to provide structural integrity of the body. Alternatively, the body may be pressed and sintered in a single operation by compressing at about the sintering temperature. The porous thermoelectric body is then impregnated with an unctuous substance such as an oil to fill the voids and densify the body. Finally, a metal coating is applied on the end surfaces of the body by methods, such as, electroplating or vapor plating and the like. Owing to the fact that the oil impregnated body is substantially devoid of pores, the metal coating does not diffuse or deeply penetrate into the thermolectric body and is therefore in good electrical and metallurgical contact therewith.

Any suitable oil having a low medium viscosity or an S.A.E. 30 weight and a flash point above 100° C. may be employed to impregnate the thermoelectric bodies. Examples of suitable oils are petroleum oils, synthetic oils, such as, polyesters, and Ucon oils and silicones and mixtures thereof.

Any compressed thermoelectric body may be impregnated with an oily substance to provide superior coating surfaces. However, it should be appreciated that most oily substances vaporize rapidly at the operating temperatures of thermoelectric generating devices (400° C. to 800° C.) and would cause the thermoelectric body to rupture. Therefore, it is particularly desirable that the process of the invention be employed with thermoelectric materials used primarily, in relatively low temperature thermoelectric refrigerant type devices wherein the oil remains intact. Materials commonly used in refrigerant type thermoelectric devices are bismuth antimony telluride, bismuth selenium telluride, bismuth telluride and antimony telluride. Any type of an oil may be employed to impregnate thermoelectric materials for refrigerant use, the only limitation being that the oil is such that metallic coating will not displace the oil in the coating process.

If the pressed thermoelectric bodies are to be employed in thermoelectric generation equipment, it is highly desirable that the impregnating liquid have a relatively low volatility, for example, a vapor pressure of from 10–20 mm. of Hg at operating temperatures so that when the device is subjected to operating temperatures, the impregnating medium will at most slowly volatilize so as to preclude rupture of the body.

The following examples are illustrative of the teachings of the invention.

EXAMPLE I

A quantity of powdered bismuth antimony telluride and bismuth selenium telluride thermoelectric materials was compressed at about 20 t.s.i. into individaul pellets (⅜" x ⅜" x 1") at 90% of theoretical density. The pellets were then sintered at 350° C. for about 24 hours. The aforementioned pellets will be designated pellet number 1 and pellet number 2, respectively. Pellet number 1 is considered a P-type material and pellet number 2 an N-type material.

An extra heavy mineral oil was heated in a suitable container to about 100° C. The pellets were immersed in the hot oil and allowed to remain there until the oil had cooled to room temperature. The pellets were then extracted from the oil, wiped and cleaned with acetone to remove the excess oil from the surfaces of the pellets. The amount of oil absorbed by a pellet appeared to be substantially constant. Pellet numbers 1 and 2 weighed approximately 7.5 grams each and the difference in oil absorbed was only 0.001 gram.

The pellets were then tested to determined whether the impregnation affected the electrical properties thereof. The pellets were masked leaving only the end surfaces to be plated exposed. The pellets were then nickel plated in the customary nickel strike and Watts bath solutions. The electrical resistivity was measured on pellets numbers 1 and 2 and compared to the measured resistivity obtained before impregnation. The results showed that the resistivity of pellet number 1 was $0.03 \times 10^{-3}$ ohm centimeters less than the resistivity before impregnation and the resistivity of pellet number 2 after impregnation was $0.09 \times 10^{-3}$ ohm centimeters less.

In addition to the formation of a more uniform plating, it was found that the pellets which had been impregnated with oil exhibited better bonding between the pellet and nickel plate than did those not so impregnated, all of the measurements being made on the same pellets before and after impregnation.

EXAMPLE II

Several pressed thermoelectric oil impregnated pellets were produced in accordance with Example I and were incorporated into a thermoelectric cooling unit consisting of eight couples. Each couple consisted of a bismuth antimony telluride thermoelectric pellet and a bismuth selenium telluride thermoelectric pellet. Another cooling unit was prepared containing thermoelectric pellets of the same thermoelectric materials with the exception that they were nickel plated without initially impregnating with oil. The total resistance of all of the non-oil impregnated units averaged about 2 milliohms higher than the oil impregnated units tested. This indicates that the contact resistance of oil impregnated pellets is lower than the contact resistance of ordinary pellets.

It is intended that the above description is only exemplary and not in limitation of the invention.

We claim as our invention:

1. In the process for preparing an oleaginous impregnated thermoelectric element devoid of a spotty finish on a metal coating attached thereto, said coating having an improved metallurgical bond with said element, the steps comprising (1) compressing a quantity of finely divided thermoelectric material to provide a thermoelectric body having end surfaces,
(2) sintering the body, the sintered body having a substantial number of voids,
(3) impregnating the body with an oleaginous substance to fill the voids,
(4) wiping the surfaces of the body clean of the oleaginous substance,
(5) applying a metal coating by electrodeposition to the end surfaces of the oleaginous impregnated body, the coating being prevented from diffusing into the body by the oleaginous material and is therefore confined to the end face surface region above and continuous with the oleaginous impregnated body in electrical and metallurgical contact therewith.

2. In the process of preparing an oil impregnated thermoelectric element devoid of a spotty finish on a metal coating attached thereto, said coating having an improved metallurgical bond with said element, the steps comprising (1) compressing a quantity of powdered thermoelectric material to provide a thermoelectric body having end surfaces, the thermoelectric material being tellurium reacted with at least one element selected from the group consisting of bismuth, antimony and selenium,
(2) sintering the body, the sintered body having a substantial number of voids,
(3) impregnating the body with oil to fill the voids,
(4) wiping the surfaces of the body clean of the oil, and
(5) applying a metal coating by electrodeposition to the end surfaces of the oil impregnated body, the coating being prevented from diffusing into the body by the oil and is therefore confined to the end face surface region above and continuous with the oil impregnated body in electrical and metallurgical contact therewith.

3. An oil impregnated thermoelectric element produced by the process of claim 1.

References Cited

UNITED STATES PATENTS

| | | | |
|---|---|---|---|
| 2,117,532 | 5/1938 | Albright et al. | 117—6 |
| 2,663,928 | 12/1953 | Wheeler | 29—420.5 X |
| 2,938,357 | 5/1960 | Sheckler | 136—230 X |
| 2,952,980 | 9/1960 | Douglas | 136—204 X |
| 3,076,051 | 1/1963 | Haba | 136—201 X |
| 3,101,285 | 8/1963 | Tantram et al. | 136—120 |
| 3,110,100 | 11/1963 | Hill | 136—201 X |
| 3,116,191 | 12/1963 | Day | 204—24 X |
| 3,129,117 | 4/1964 | Harding et al. | 136—201 X |
| 3,220,199 | 11/1965 | Hanlein et al. | 136—240 X |
| 3,224,071 | 12/1965 | Levi et al. | 29—420.5 X |

FOREIGN PATENTS

| | | |
|---|---|---|
| 211,206 | 11/1957 | Australia. |
| 685,264 | 12/1952 | Great Britain. |
| 128,519 | 8/1960 | U.S.S.R. |

WINSTON A. DOUGLAS, *Primary Examiner.*

A. M. BEKELMAN, *Assistant Examiner.*